(12) United States Patent
Ishikawa et al.

(10) Patent No.: US 7,375,158 B2
(45) Date of Patent: May 20, 2008

(54) THERMOCONDUCTIVE CURABLE LIQUID POLYMER COMPOSITION AND SEMICONDUCTOR DEVICE PRODUCED WITH THE USE OF THIS COMPOSITION

(75) Inventors: Hiroki Ishikawa, Aichi Prefecture (JP); Katsutoshi Mine, Chiba Prefecture (JP); Kimio Yamakawa, Chiba Prefecture (JP); Kazumi Nakayoshi, Chiba Prefecture (JP)

(73) Assignee: Dow Corning Toray Silicone Company, Ltd., Tokyo (JP)

( * ) Notice: Subject to any disclaimer, the term of this patent is extended or adjusted under 35 U.S.C. 154(b) by 364 days.

(21) Appl. No.: 10/511,659

(22) PCT Filed: May 29, 2003

(86) PCT No.: PCT/JP03/06798

§ 371 (c)(1),
(2), (4) Date: Nov. 17, 2004

(87) PCT Pub. No.: WO03/102071

PCT Pub. Date: Dec. 11, 2003

(65) Prior Publication Data

US 2005/0181213 A1    Aug. 18, 2005

(30) Foreign Application Priority Data

May 31, 2002    (JP)    ............... 2002-158434

(51) Int. Cl.
*C08L 83/04* (2006.01)

(52) U.S. Cl. .............. 524/588; 524/781; 524/783; 524/786; 524/758; 524/114

(58) Field of Classification Search ............. 524/781, 524/783, 786, 758; 588/114, 588
See application file for complete search history.

(56) References Cited

U.S. PATENT DOCUMENTS 5,087,642 A * 2/1992 Seki et al. ............. 523/156

FOREIGN PATENT DOCUMENTS

JP    60-228587    * 11/1985
JP    63-115928    *  5/1988

* cited by examiner

*Primary Examiner*—Kuo-Liang Peng
(74) *Attorney, Agent, or Firm*—Howard & Howard Attorneys, P.C.

(57) ABSTRACT

A thermoconductive curable liquid polymer composition including (A) a curable liquid polymer, (B) a filler made from a thermally-elongatable shape-memory alloy, and (C) a thermoconductive filler other than (B). A semiconductor device having a semiconductor element glued or coated with the thermoconductive curable liquid polymer composition.

14 Claims, 1 Drawing Sheet ature above the transition point of the shape memory alloy filler, which constitutes component (B). The following are examples
THERMOCONDUCTIVE CURABLE LIQUID POLYMER COMPOSITION AND SEMICONDUCTOR DEVICE PRODUCED WITH THE USE OF THIS COMPOSITION This invention relates to a thermoconductive curable liquid polymer composition and a semiconductor device manufactured with the composition. More specifically, the invention relates to a thermoconductive curable liquid polymer composition, which prior to curing possesses good flowability and after curing produces a cured body of excellent thermal conductivity. The invention further relates to a semiconductor device that demonstrates high reliability provided by coating or by adhesively connecting semiconductor elements with the composition.

BACKGROUND OF THE INVENTION

Curable liquid compositions that contain thermoconductive fillers find application in the manufacture of electrical and electronic devices as heat-radiating adhesives, potting agents, or protective coatings. In particular, a curable liquid silicone composition comprising a liquid organopolysiloxane with at least two alkenyl groups in one molecule, a liquid organopolysiloxane with at least two silicon-bonded hydrogen atoms in one molecule, a hydrosilylation reaction metal catalyst, and a thermoconductive filler is suitable for forming cured bodies of low internal stress and excellent thermal conductivity. Therefore, this composition finds application in the manufacture of heat-removing adhesives placed between the semiconductor elements and heat-dissipation fins, as well as in the production of protective coating agents, potting agents, and heat-removing adhesives used in electric and electronic parts and devices.

It is not unusual that for further increase in thermal conductivity of the aforementioned thermoconductive liquid composition, it is combined with an additional amount of a thermoconductive filler. However, an increase in the content of a thermoconductive filler increases viscosity of the composition, which impairs conditions for the discharge of the composition from dispensing devices, such as syringes, and does not provide stability of the shape after application.

OBJECTS OF THE INVENTION

It has been found that flowability prior to curing and thermal conductivity after curing can be achieved by combining a thermoconductive filler with a thermally-elongatable shape memory alloy in the composition. Therefore, it is an object of this invention to provide a thermoconductive curable liquid polymer composition, which prior to curing possesses flowability and after curing produces a cured body of excellent thermal conductivity. A further object is to provide a semiconductor device that demonstrates high reliability provided by coating or by adhesively connecting semiconductor elements with the composition.

SUMMARY OF THE INVENTION

A thermoconductive curable liquid polymer composition of this invention comprises: (A) a curable liquid polymer; (B) a filler made from a thermally-elongatable shape-memory alloy; and (C) a thermoconductive filler other than component (B). A semiconductor device of the invention has semiconductor elements that are glued or coated with the thermoconductive curable liquid polymer composition.

DETAILED DESCRIPTION OF THE PREFERRED EMBODIMENTS

Figure 1:
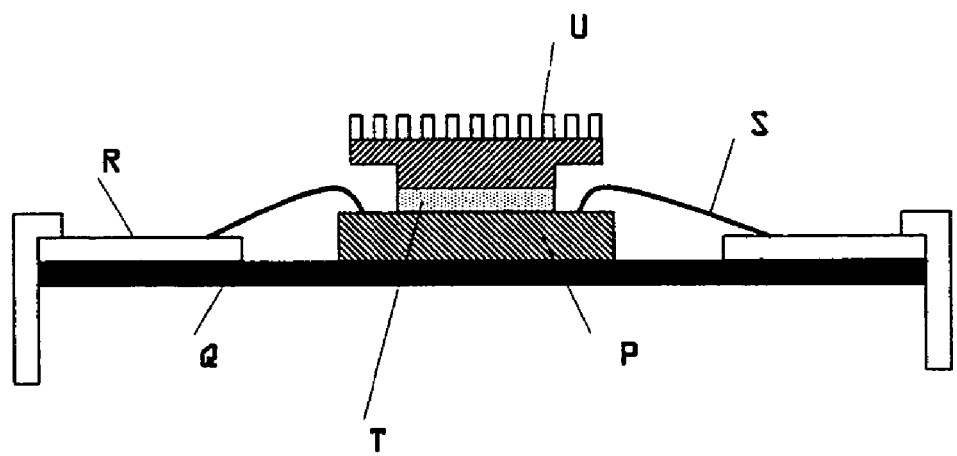
FIG. 1 is a cross-sectional view of an LSI shown in the form of a semiconductor device of this invention.
1 semiconductor element
2 circuit substrate
3 circuit pattern element
4 bonding wire
5 thermoconductive curable liquid polymer composition
6 heat-dissipation fins

A curable liquid polymer of component (A) may comprise a thermosetting liquid polymer, room-temperature-curable liquid polymer, moisture-curable liquid polymer, ultraviolet-ray-curable liquid polymer, electron-beam-curable liquid polymer, etc. Among these, the most preferable is a thermosetting liquid polymer. If component (A) does not possess thermosetting properties, then, in order to cause elongation of component (B) prior to curing, during curing, or after curing, it is necessary to increase the temperature above the transition point of the shape memory alloy filler, which constitutes component (B). The following are examples suitable for use as component (A): a curable liquid epoxy resin, curable liquid silicone, curable liquid polyimide resin, curable liquid phenol resin, curable liquid polyphenylene-sulfide resin, curable liquid unsaturated polyester resin, curable liquid polyurethane resin, and a curable liquid diallylphthalate resin. Most preferable among the above are a curable liquid epoxy resin or a curable liquid silicone, which, when cured, acquires a rubber-like or a gel-like state. The curable liquid epoxy resin may be of a bisphenol type, biphenyl type, novolac type, etc., and is normally used in combination with a curing agent. The curable liquid silicone may be represented by a liquid silicone composition curable by means of an addition reaction, a liquid silicone composition curable in a reaction promoted with the use of a peroxide compound, a liquid silicone composition curable by means of a condensation reaction, a liquid silicone composition curable under the effect of ultraviolet rays, and a radiation-curable liquid silicone composition. The most preferable of the above is a liquid silicone composition curable by means of an addition reaction. It is recommended to use component (A) in the composition of the invention in an amount of 2.0 to 70 wt. %, preferably 5.0 to 50 wt. %.

Component (B) is a filler. Component (B) is made from a thermally-elongatable shape memory alloy which elongates after heating to a temperature exceeding its transition point. Component (B) significantly improves thermal conductivity of the composition. This makes it possible to reduce the content of component (C). The filler of component (B) can be represented by a shape memory alloy of a Ti—Ni type, Cu—Zn—Al type, Cu—Al—Ni type, or the like. This alloy may be used in the form of fibers, scales, flakes or plates. The fiber shape is preferable. It is recommended that the diameter of the fiber shaped particles be 5 to 500 micrometers (μm), preferably 10 to 300 μm. It is recommended that the average particle diameter of the scale or flake or plate shaped particles be 5 to 500 micrometers (μm), preferably 10 to 300 μm. The filler particles may have a coil (helical) shape, a ring shape, or a curl shape. In the case of coil-shaped particles, it is recommended that their core diameter be 0.01 to 5.0 millimeters (mm), preferably 0.1 to 1.0 mm. It is recommended that the normal length of the particles be 10 μm to 10 mm, preferably 20 μm to 2 mm. It is recommended that the length after elongation be 0.1 to 50 mm, preferably from 0.2 to 10 mm. It is recommended that heating allows 2 to 50-fold, preferably 3 to 15-fold increase in the length of the component (B). The surface of component (B) can be treated with an organohalosilane, organoalkoxysilane, organosilazane, or a similar organic silicon compound. The aforementioned shape-memory alloy fillers can be used in a combination. It is recommended to use component (B) in the composition of the invention in an amount of 0.01 to 30 wt. %, preferably in an amount of 0.1 to 20 wt. %.

There are no special limitations with regard to the type of thermoconductive filler (C), except that it should not be the same as component (B). For example, component (C) can be silica, alumina, glass, silicate, silicon nitride, boron nitride, aluminum nitride, silicon carbide, titanium oxide, carbon black, diamond, or a similar inorganic-type filler; aluminium, aluminium hydroxide, aluminum sulfide, gold, silver, copper, nickel, solder, brass, palladium, or a similar metal-type filler; an organic resin filler containing the aforementioned fillers; or mixtures of the above. Among the above, the inorganic fillers and metal fillers have the best thermal conductivity. It is recommended that particles of component (C) have diameters of 0.1 to 500 μm, preferably 0.1 to 100 μm. Particles of component (C) can be surface-treated with an organohalosilane, organoalkoxysilane, organosilazane, or a similar organic silicon compound. The aforementioned thermoconductive fillers can be used in a combination. It is recommended to use component (C) in the composition of the invention in an amount of 30 to 98 wt. %, preferably from 50 to 95 wt. %.

At room temperature, the composition of the invention is liquid. More specifically, at 25° C., the composition may have viscosity of 0.1 to 100,000 Pascal·seconds (Pa·s), preferably 0.5 to 50,000 Pa·s, more preferably 0.5 to 10,000 Pa·s. There are no special restrictions with regard to hardness after curing, and the product may be produced in the form of resin, rubber, or gel, or it may be produced as a partially-cross-linked, i.e, semi-cured rubber or gel. It is advantageous to cure the composition of the invention into a soft, semi-cured gel when it is used to form an adhesive or a coating for a semiconductor device. In this case, it is recommended that the hardness of a cured product measured in accordance with JIS K6253 is less than 10, and preferably is equal to 0. As viscosity and flowability of the composition of the invention will vary depending on viscosity of component (A), as well as on the shape and size of component (B) and on the shape and size of component (C), the components of the composition should be proportioned so as to provide an appropriate flowability.

When component (A) is a curable liquid silicone, a thermoconductive addition-reaction-curable liquid silicone composition preferably having a viscosity of 0.1 to 300 Pa·s at 25° C. may be prepared from the following components:
  (a) 100 parts by weight of a liquid organopolysiloxane having at least two alkenyl groups per molecule;
  (b) 0.001 to 100 parts by weight of a liquid organopolysiloxane having at least two silicon-bonded hydrogen atoms per molecule;
  (c) hydrosilylation-reaction metal catalyst used in such an amount that in terms of weight units the content of metal atoms in the catalyst is 0.01 to 1,000 parts per million (ppm) based on the total weight of the composition;
  (B) a filler made from a thermally-elongatable shape memory alloy; and
  (C) a thermoconductive filler other than component (B).

Aforementioned component (a) is characterized by having at least two silicon-bonded alkenyl groups per molecule. Structurally this component may have a linear chain, a partially-branched linear chain, a branched chain, a cyclic, or a net-like structure. The linear-chain structure is preferable. The following are examples of suitable alkenyl groups: vinyl group, allyl group, and hexenyl group. Bonding positions of the alkenyl group may be at the molecular terminals and/or along the side molecular chain. Positions at both molecular terminals are preferable. The silicon-bonded groups other than the alkenyl group may be the following substituted or unsubstituted monovalent hydrocarbon groups: methyl group, ethyl group, propyl group, butyl group, pentyl group, hexyl group, heptyl group, or similar alkyl group; phenyl group, tolyl group, xylyl group, naphthyl group, or a similar aryl group; benzyl group, phenethyl group, or a similar aralkyl group; chloromethyl group, 3-chloropropyl group, 3,3,3-trifluoropropyl group, or a similar halogenated alkyl group. The most preferable among the above are methyl and phenyl groups. It is recommended that the viscosity of component (a) be 10 to 1,000,000 milliPascal·seconds (mPa·s) at 25° C., preferably 100 to 50,000 mPa·s. If the viscosity of component (a) is below 10 mPa·s, it would be difficult to provide sufficient mechanical strength after curing. If the viscosity of component (a) exceeds 1,000,000 mPa·s, the composition would be difficult to handle because it becomes too viscous.

Component (b) contains at least two silicon-bonded hydrogen atoms per molecule. Component (b) may comprise a cross-linking agent or the curing agent of component (a). Therefore, when component (a) contains two alkenyl groups, the number of silicon-bonded hydrogen atoms should be three or more. Component (b) may have a linear, partially-branched linear, branched, or a net-like molecular structure. A bonding position of the silicon-bonded hydrogen atom may be at the molecular terminals and/or along the side molecular chain. The silicon-bonded groups other than the silicon-bonded hydrogen may be the following substituted or unsubstituted monovalent hydrocarbon groups: methyl group, ethyl group, propyl group, butyl group, pentyl group, hexyl group, heptyl group, or a similar alkyl group; phenyl group, tolyl group, xylyl group, naphthyl group, or a similar aryl group; benzyl group, phenethyl group, or a similar aralkyl group; chloromethyl group, 3-chloropropyl group, 3,3,3-trifluoropropyl group, or a similar halogenated alkyl group. The most preferable among the above are methyl and phenyl groups. It is recommended that the viscosity of component (b) be 0.1 to 1,000,000 mPa·s at 25° C., preferably from 0.2 to 10,000 mPa·s. It is recommended to use component (b) in an amount of 0.001 to 100 parts by weight, preferably from 0.001 to 30 parts by weight, for each 100 parts by weight of component (a). If component (b) is used in an amount less than 0.001 parts by weight, it would be difficult to completely cure the composition. If the content of component (b) exceeds 100 parts by weight, it would be difficult to obtain a cured body of sufficient physical strength. To cure the composition to a sufficient degree, it is recommended that alkenyl groups of component (a) be present in an amount of 0.1 to 10 moles, preferably 0.5 to 5 moles, for each 1 mole of the silicon-bonded hydrogen atoms of component (b). If the aforementioned alkenyl groups are in an amount less than 0. mole, it would be difficult to ensure sufficient curing. If the alkenyl groups exist in an amount exceeding 10 moles, the cured body will be produced with reduced physical strength.

Component (c) is a catalyst for the addition reaction of the silicon-bonded hydrogen atoms of component (b) to the alkenyl groups of component (a). Component (c) may comprise a platinum-type catalyst, rhodium-type catalyst, or a palladium-type catalyst. The platinum catalyst is the most preferable. The following are specific examples of the aforementioned catalysts: a platinum powder, platinum black, platinum on a fine silica powder carrier, platinum on an activated carbon carrier, a chloroplatinic acid, an alcoholic solution of a chloroplatinic acid, a platinum-olefin complex, a platinum-alkenylsiloxane complex, or a similar platinum-type catalyst. It is recommended to add component (c) in such an amount that, in terms of weight units, the content of metal atoms in component (c) is 0.01 to 1,000 ppm, preferably 0.01 to 100 ppm in the composition of the invention. If the aforementioned content is below 0.01 ppm, the addition reaction would not properly progress and it would be difficult to ensure sufficient curing. If the content of component (c) exceeds 1,000 ppm, it would not noticeably further promote the addition reaction, but would make the cost of the composition economically unjustifiable.

A filler (B) made from a thermally-elongatable shape-memory alloy and a thermoconductive filler (C), other than the aforementioned filler (B), are the same as defined above. It is recommended to use component (B) in the amount of 1 to 1,000 parts by weight, preferably in the amount of 1 to 500 parts by weight for each 100 parts by weight of component (a). It is recommended to use component (C) in the amount of 50 to 5,000 parts by weight, preferably in the amount of 100 to 3,000 parts by weight for each 100 parts by weight of component (a).

The thermoconductive liquid silicone composition curable by means of an addition reaction is prepared from the components described above. However, other components can be added. These additional components include the following: shape memory resin, silicone resin, fluoro resin, or a similar fine organic resin powder, as well as dyes, pigments, flame retardants, solvents, etc. The shape memory resin can be exemplified by a vinyl-type polymer, olefin-type polymer, acryl-type polymer, caprolactone-type polymer, ester-type polymer, urethane-type polymer, or compounds prepared from the aforementioned organic resins and the shape-memory alloys.

To adjust the speed of the addition reaction, the composition may incorporate addition-reaction inhibitors, such as 3-methyl-1-butyn-3-ol, 3,5-dimethyl-1-hexyn-3-ol, phenyl butynol, or a similar alkyne alcohol; 3-methyl-3-penten-1-yne, 3,5-dimethyl-3-hexen-1-yne, or a similar enyne compound; 1,3,5,7-tetramethyl-1,3,5,7-tetravinyl cyclotetrasiloxane, 1,3,5,7-tetramethyl-1,3,5,7-tetrahexenyl cyclotetrasiloxane, benzotriazole, or the like. It is recommended to use the aforementioned addition-reaction inhibitors in the amount of 0.0001 to 5 parts by weight for each 100 parts by weight of component (a).

An adhesion imparting agent can be added for imparting adhesive properties to the composition. Although there are no special restrictions with regard to the aforementioned adhesion imparting agent, it is recommended to use for this purpose an organopolysiloxane having in one molecule at least one silicon-bonded alkenyl group or a hydrogen atom, and at least one silicon-bonded alkoxy group. The aforementioned organopolysiloxane may have a linear, partially branched linear, branched, cyclic, or net-like molecular structure. The silicon-bonded alkenyl group can be represented by a vinyl group, allyl group, butenyl group, pentenyl group, and hexenyl group, of which the vinyl group is the most preferable. The silicon-bonded alkoxy group can be represented by methoxy group, ethoxy group, propoxy group, butoxy group, and methoxyethoxy group, of which the methoxy group is the most preferable. The silicon-bonded groups other than alkenyl groups, hydrogen atoms, and alkoxy groups may be represented by a monovalent unsubstituted hydrocarbon group such as methyl group, ethyl group, propyl group, butyl group, pentyl group, hexyl group, heptyl group, or a similar alkyl group; phenyl group, tolyl group, xylyl group, naphthyl group, or a similar aryl group; benzyl group, phenethyl group, or a similar aralkyl group; a monovalent substituted hydrocarbon group such as chloromethyl group, 3-chloropropyl group, 3,3,3-trifluoropropyl group, or a similar halogenated alkyl group; 3-glycidoxypropyl group, 4-glycidoxybutyl group, or a similar glycidoxyalkyl group, 2-(3,4-epoxychlorohexyl)ethyl group, 3-(3,4-epoxycyclohexyl)propyl group, or a similar epoxy-containing monovalent organic group; 4-oxylanylbutyl group, 8-oxylanyloctyl group, or a similar oxylanylalkyl group. The most preferable among the above is the epoxy-containing monovalent organic group, as it imparts good adhesive properties to various substrates. The aforementioned organopolysiloxane is a low-viscous liquid substance, which at 25° C. has a viscosity within the range of 1 to 500 mPa·s.

An addition reaction is carried out at room temperature or with heating. The speed of the reaction is higher when it proceeds with heating. It is recommended to carry out heating at a temperature of 50 to 250° C., preferably 80 to 200° C.

As component (B) used in the composition of the invention is characterized by an increased thermal conductivity, the composition can be compounded with a reduced amount of a thermoconductive filler (C). Since prior to thermal elongation, the particles of component (B) are small in shape, the composition of the invention has excellent flowability, is easy to handle, and is suitable for use under industrial conditions. Therefore, the composition may find application in the manufacture of adhesives, potting agents, and protective coatings for parts and units of electrical and electronic devices. In particular, the composition of the invention is suitable for use as a coating agent and adhesive for semiconductor devices, such as semiconductor elements and heat dissipation fins.

The following is a detailed description of a semiconductor device produced by using the composition of this invention. A semiconductor device of this invention comprises a semiconductor element attached to a substrate, or coated, by means of a thermoconductive liquid polymer composition of the invention. Since a cured body produced from the composition of the invention has improved thermal conductivity and adhesion to a substrate, the device will be characterized by improved heat dissipation properties and reliability. Semiconductor devices of the present invention may comprise diodes, transistors, thyristors, monolithic IC, hybrid IC, LSI, and VLSI. Semiconductor elements of the invention may comprise diodes, transistors, thyristors, monolithic IC, and semiconductor elements of hybrid IC's.

An example of a semiconductor device of the invention is an LSI, the cross-section of which is shown in FIG. 1. The device consists of a semiconductor element 1 supported by a circuit substrate 2. The semiconductor element 1 and a circuit pattern element 3 connected to an external lead wire are electrically connected by means of a bonding wire 4. The surface of the semiconductor element 1 supports a thermoconductive curable liquid polymer composition 5 of this invention, which functions as a protective layer for the semiconductor element and as an adhesive agent for heat dissipation fins 6. The circuit substrate 2 can be made from a glass-fiber reinforced epoxy resin, bakelite resin, phenol resin, or a similar organic resin; alumina or a similar ceramic; copper, aluminum, or another metal. The circuit pattern element 3 may be made from copper or silver-palladium. Typical materials of the bonding wire 4 are gold, copper, and aluminum. Heat dissipation fins 6 are produced from aluminum, copper, nickel, or the like. In addition to semiconductor element 1, the circuit substrate 2 may support other electronic parts such as resistors, capacitors, coils, etc.

In the manufacture of the semiconductor device of the invention, first the semiconductor element 1 is placed onto the circuit substrate 2, the semiconductor element 1 and the circuit pattern element 3 are electrically interconnected by means of the boding wire 4, the thermoconductive curable liquid polymer composition 5 is applied onto the surface of the semiconductor element 1, and the plate with heat dissipation fins 6 is attached to the device. The entire unit is then heated to a temperature of 50 to 200° C. and, as a result, the semiconductor element 1 and the heat dissipation fins 6 are fixed in place.

EXAMPLES

In the following examples, all viscosities are measured at 25° C. Thermal conductivity, hardness, and reliability were evaluated by the methods described below.

Method for Evaluating Thermal Conductivity of the Cured Body

The thermal conductivity of the thermoconductive curable liquid polymer composition was measured on a (15 cm long×6 cm wide×2 cm thick) cured body sample using a Quick Thermal Conductivity Meter, Model QTM-500, available from Kyoto Electronics Manufacturing Co., Ltd.

Method for Evaluating Hardness of the Cured Body

The hardness of the cured product of the thermoconductive curable liquid polymer composition was measured using a Type A durometer as specified in JIS K 6253.

Method for Evaluating Reliability of the Semiconductor Device

A semiconductor device of the type shown in FIG. 1 was produced by placing a semiconductor element 1 onto a circuit substrate 2 made from a glass-fiber-reinforced epoxy resin and supporting external lead wires attached to the terminal portion, and a circuit pattern element 3 printed on the substrate surface. The circuit pattern element 3 was then electrically connected to the electronic element 1 by a bonding wire 4. After the surface of the electronic element was coated with the thermoconductive curable liquid polymer composition 5 supplied from a dispenser, a plate 6 with aluminum heat dissipation fins was glued to the aforementioned surface, and the entire unit was heated at 150° C. in a hot-air-circulation oven, whereby the heat-dissipation fins 6 was fixed to the semiconductor element 1. Twenty semiconductor devices were produced by this method.

Each semiconductor device was subjected to thermal cycle testing with one cycle consisting of holding for 30 minutes at −65° C. and for 30 minutes at +150° C. Defects were determined by observing conditions of the cured composition between the semiconductor element 1 and the heat dissipation fins 6 under a microscope after 1,000 cycles. The samples did not pass the test if, after the test, the semiconductor 1 and the heat dissipation fins 6 were separated. The defect rate was determined from the number of devices that did not pass the test.

Reference Example 1

The linear shape of a 80 μm-diameter, 4 mm-long Cu—Zn—Al shape-memory alloy wire (from Nippon Tungsten Co, Ltd.) was memorized by quickly cooling after heating for 1 hour at 300° C. The wire was then wound around a rod to shape a Cu—Zn—Al memory alloy wire in the form of a coil. The core of the obtained coil-type shape-memory alloy had a diameter of 0.55 mm and a length of 0.55 mm. The transition point temperature was 120° C.

Practical Example 1

A mixture was prepared from 100 parts by weight of a 2000 mPa·s viscosity bisphenol-type epoxy resin having epoxy-equivalent quantity of 165 g; product of Tohto Kasei Co., Ltd., trademark ZX-1059; and 65 parts by weight of a diphenyldihydroxysilane which is solid at room temperature and has hydroxy-equivalent quantity of 108 grams (g). The mixture was melted by heating at 120° C. After cooling to room temperature, the product was mixed with a 1100 parts by weight of a 200 mPa·s viscosity copolymer of a dimethylsiloxane and a diphenylsiloxane having both molecular terminals capped with a trimethylsiloxy and 1.0 part by weight of an aluminum tris(acetylacetonate). The components were uniformly mixed, and 800 mPa·s viscosity curable epoxy resin composition was obtained. One hundred parts by weight of the obtained epoxy resin composition were combined with 600 parts by weight of 10 μm average diameter alumina spherical particles (trademark "Admafine Alumina" produced by Admatex Co., Ltd.), and 10 parts by weight of the coil-shaped Cu—Zn—Al shape memory alloy obtained in Reference Example 1. After the components were uniformly mixed at room temperature, a 65 Pa·s viscosity thermoconductive curable liquid epoxy resin composition was obtained.

A cured body was produced from the obtained thermoconductive curable liquid epoxy resin composition by heating for 3 hours at 150° C. By the methods specified above, the cured body produced from the aforementioned composition was evaluated with regard to thermal conductivity and hardness, while the semiconductor device manufactured with the composition was evaluated with regard to reliability. The results of the evaluation are shown in Table 1.

Comparative Example 1

A 66 Pa·s viscosity curable liquid epoxy resin composition was obtained by the same method as in Practical Example 1, with the exception that 10 parts by weight of 10 μm average diameter alumina spherical particles were used instead of 10 parts by weight of the coil-shaped Cu—Zn—Al shape memory alloy.

A cured body was produced from the obtained thermoconductive curable liquid epoxy resin composition by heating for 3 hours at 150° C. By the methods specified above, the cured body produced from the aforementioned composition was evaluated with regard to thermal conductivity and hardness, while the semiconductor device manufactured with the composition was evaluated with regard to reliability. The results of the evaluation are shown in Table 1.

Practical Example 2

A mixture was prepared from 100 parts by weight of a 2000 mPa·s viscosity dimethylpolysiloxane having both molecular terminals capped with dimethylvinylsiloxy groups (0.24 wt. % content of the vinyl groups), 0.6 parts by weight of 20 mPa·s viscosity copolymer of a methylhydrogensiloxane and a dimethylsiloxane having both molecular terminals capped with trimethylsiloxy groups (0.75 wt. % content of silicon-bonded hydrogen atoms), and a platinum-1,3-divinyl-1,1,3,3-tetramethyldisiloxane complex (5 ppm content of metallic platinum in the composition in weight units). The components were combined and uniformly mixed with 600 parts by weight of the spherical alumina particles used in Practical Example 1 and 0.01 parts by weight of an addition-reaction inhibitor in the form of a 3-phenyl-1-buten -3-ol.

The mixture was additionally combined and uniformly mixed at room temperature with 10 parts by weight of the coil-shaped Cu—Zn—Al shape memory alloy obtained in Reference Example 1. As a result, a 72 Pa·s viscosity thermoconductive curable liquid silicone composition was prepared.

A cured body was produced from the thermoconductive curable liquid silicone composition by heating for 1 hour at 150° C. By the methods specified above, the cured body produced from the aforementioned composition was evaluated with regard to thermal conductivity and hardness, while the semiconductor device manufactured with the composition was evaluated with regard to reliability. The results of the evaluation are shown in Table 1.

Comparative Example 2

A 74 Pa·s viscosity curable liquid silicone composition was obtained by the same method as in Practical Example 2, with the exception that 10 parts by weight of alumina spherical particles were used instead of 10 parts by weight of the coil-shaped Cu—Zn—Al shape memory alloy.

A cured body was produced from the thermoconductive curable liquid silicone composition by heating for 1 hour at 150° C. By the methods specified above, the cured body produced from the aforementioned composition was evaluated with regard to thermal conductivity and hardness, while the semiconductor device manufactured with the composition was evaluated with regard to reliability. The results of the evaluation are shown in Table 1.

Comparative Example 3

A 345 Pa·s viscosity curable liquid silicone composition was obtained by the same method as in Practical Example 2, with the exception that 180 parts by weight of alumina spherical particles of Practical Example 1 were used instead of 10 parts by weight of the coil-shaped Cu—Zn—Al shape memory alloy. A cured body was produced from the curable liquid silicone composition by heating for 1 hour at 150° C. By the same methods as specified above for the composition of Practical Example 2, the cured body produced from the composition of this comparative example was evaluated with regard to thermal conductivity and hardness, while the semiconductor device manufactured with the composition was evaluated with regard to reliability. The results of the evaluation are shown in Table 1. Comparison showed that the composition of this comparative example was more difficult to spread than the composition of Practical Example 2. Therefore it was less suitable for industrial production of semiconductor devices than the composition of the invention.

TABLE 1

|  | Practical Examples | | Comparative Examples | | |
| --- | --- | --- | --- | --- | --- |
|  | 1 | 2 | 1 | 2 | 3 |
| Thermal conductivity (W/m · K) | 1.7 | 1.7 | 1.4 | 1.4 | 1.7 |
| Hardness | 0 | 0 | 0 | 0 | 35 |
| Number of semiconductor devices that did not pass reliability test (%) | 0 | 0 | 0 | 0 | 10 |

INDUSTRIAL APPLICABILITY

As the thermoconductive curable liquid polymer composition of the invention possesses flowability prior to curing, it provides excellent conditions for manufacturing under industrial conditions. The composition may find application in the manufacture of adhesives, potting agents, and protective coatings for parts and units of electrical and electronic devices. In particular, the composition of the invention is suitable for use as a coating agent and adhesive for semiconductor devices, such as semiconductor elements and heat dissipation fins.

A cured body formed from the composition after curing is characterized by high thermal conductivity. Furthermore, semiconductor devices of the present invention, which are assembled from semiconductor elements attached or coated with the aforementioned thermoconductive curable liquid polymer composition are characterized by improved reliability. Semiconductor devices of this invention may comprise diodes, transistors, thyristors, monolithic IC, hybrid IC, LSI, and VLSI. Semiconductor elements of the invention may comprise diodes, transistors, thyristors, monolithic IC, and semiconductor elements of hybrid IC's.

What is claimed is:

1. A thermoconductive curable liquid polymer composition comprising:
   (A) a curable liquid polymer;
   (B) a filler made from a thermally-elongatable shape memory alloy comprising Cu-Zn-Al memory alloy filler; and
   (C) a thermoconductive filler comprising alumina, with the proviso that component (C) differs from component (B).

2. The thermoconductive curable liquid polymer composition of claim 1, where component (B) has a coil shape.

3. The thermoconductive curable liquid polymer composition of claim 1, wherein said component (A) is a curable liquid epoxy resin.

4. The thermoconductive curable liquid polymer composition of claim 1, where said component (A) comprises a curable liquid silicone.

5. The thermoconductive curable liquid polymer composition of claim 4, where said curable liquid silicone is a liquid silicone composition curable by means of an addition reaction.

6. The thermoconductive curable liquid polymer composition of claim 5, where said component (A) comprises:
   (a) 100 parts by weight of a liquid organopolysiloxane having at least two alkenyl groups per molecule;

(b) 0.001 to 100 parts by weight of a liquid organopolysiloxane having at least two silicon-bonded hydrogen atoms per molecule; and (c) a hydrosilylation reaction metal catalyst, which in terms of weight units contains metal atoms in an amount of 0.01 to 1,000 ppm based on the weight of the composition.

7. The thermoconductive curable liquid polymer composition of claim 1, where said component (A) is present in an amount of 2.0 to 70 wt %, said component (B) is present in an amount of 0.01 to 30 wt %, and said component (C) is present in an amount of 30 to 98 wt % in the composition of the invention.

8. The thermoconductive curable liquid polymer composition of claim 1, where said component (A) is present in an amount of 5.0 to 50 wt %, said component (B) is present in an amount of 0.1 to 20 wt %, and said component (C) is present in an amount of 50 to 95 wt % in the composition of the invention.

9. The thermoconductive curable liquid polymer composition of claim 1, where said component (A) is present in an amount of 5.0 to 50 wt %, said component (B) is present in an amount of 0.1 to 20 wt %, and said component (C) is present in an amount of 50 to 95 wt % in the composition of the invention.

10. A thermoconductive curable liquid polymer composition comprising:

(A) a curable liquid polymer comprising a curable liquid silicone;

(B) a filler made from a thermally-elongatable shape memory alloy; and (C) a thermoconductive filler, with the proviso that component (C) differs from component (B).

11. The thermoconductive curable liquid polymer composition of claim 10, where component (B) has a coil shape.

12. The thermoconductive curable liquid polymer composition of claim 10, where said curable liquid silicone is a liquid silicone composition curable by means of an addition reaction.

13. The thermoconductive curable liquid polymer composition of claim 12, where said component (A) comprises:

(a) 100 parts by weight of a liquid organopolysiloxane having at least two alkenyl groups per molecule;

(b) 0.001 to 100 parts by weight of a liquid organopolysiloxane having at least two silicon-bonded hydrogen atoms per molecule; and (c) a hydrosilylation reaction metal catalyst, which in terms of weight units contains metal atoms in an amount of 0.01 to 1,000 ppm based on the weight of the composition.

14. The thermoconductive curable liquid polymer composition of claim 10, where said component (A) is present in an amount of 2.0 to 70 wt %, said component (B) is present in an amount of 0.01 to 30 wt %, and said component (C) is present in an amount of 30 to 98 wt % in the composition of the invention.

* * * * *